(12) United States Patent
Sim

(10) Patent No.: US 9,999,100 B2
(45) Date of Patent: Jun. 12, 2018

(54) DC HEATER

(71) Applicant: Cell ID Pte Ltd, Singapore (SG)

(72) Inventor: Lye Hock Sim, Singapore (SG)

(73) Assignee: CELL ID PTE LTD, Singapore (SG)

( * ) Notice: Subject to any disclaimer, the term of this patent is extended or adjusted under 35 U.S.C. 154(b) by 0 days. days.

(21) Appl. No.: 14/893,002

(22) PCT Filed: Apr. 7, 2015

(86) PCT No.: PCT/SG2015/050062
§ 371 (c)(1),
(2) Date: Nov. 20, 2015

(87) PCT Pub. No.: WO2016/163946
PCT Pub. Date: Oct. 13, 2016

(65) Prior Publication Data
US 2017/0094724 A1    Mar. 30, 2017

(51) Int. Cl.
*H05B 3/16* (2006.01)
*H05B 3/34* (2006.01)

(52) U.S. Cl.
CPC ..................................... *H05B 3/34* (2013.01)

(58) Field of Classification Search
CPC ... H05B 3/34; H05B 3/54; H05B 3/36; H05B 3/38; H05B 3/78; H05B 3/80; H05B 3/82; H05B 3/26; H05B 2203/00; H05B 2203/002; H05B 2203/003; H05B 2203/004; H05B 2203/009; H05B 2203/013; H05B 2203/016; H05B 2203/021; H05B 1/0244; H05B 1/025; H05B 1/0247; H05B 1/0288; H05B 1/0297; G01N 33/53; G01N 33/5302; B01J 2219/00495; B01J 2219/00637; B01J 2219/00529
See application file for complete search history.

(56) References Cited

U.S. PATENT DOCUMENTS 6,255,677 B1 * 7/2001 Caillat ................. C12Q 1/6837
257/252
6,533,255 B1    3/2003 Mitsuhashi et al.
(Continued)

FOREIGN PATENT DOCUMENTS

DE    102012219656 A1    4/2014
EP       0890651 A1    1/1999
(Continued)

OTHER PUBLICATIONS

Foreign Communication From a Related Counterpart Application, International Search Report and Written Opinion dated Jun. 30, 2015, International Application No. PCT/SG2015/050062 filed on Apr. 7, 2015.
(Continued)

*Primary Examiner* — Shawntina Fuqua

(57) ABSTRACT

A dc heater comprising: a discrete heating area made of a heat conductive material disposed on a surface that is electrically non-conductive; and at least one conductive trace configured to be connected to a dc voltage source and to heat the discrete heating area to a uniform temperature when connected to the dc voltage source, the at least one conductive trace disposed in an undulating configuration on the surface at least partially around the discrete heating area.

5 Claims, 3 Drawing Sheets

(56) References Cited

U.S. PATENT DOCUMENTS

| | | |
|---|---|---|
| 2002/0079219 A1 | 6/2002 | Zhao et al. |
| 2002/0127152 A1 | 9/2002 | Benett et al. |
| 2002/0192112 A1 | 12/2002 | Chow |
| 2003/0183620 A1 | 10/2003 | Wong |
| 2005/0028587 A1 | 2/2005 | Baer et al. |
| 2007/0049869 A1 | 3/2007 | Park |
| 2008/0026430 A1 | 1/2008 | Sarofim et al. |
| 2008/0083740 A1* | 4/2008 | Kaiserman ............... A43B 7/04 219/520 |
| 2008/0286153 A1 | 11/2008 | Lee et al. |
| 2009/0186404 A1 | 7/2009 | Kim et al. |
| 2012/0270225 A1 | 10/2012 | Wakeley et al. |
| 2014/0162244 A1 | 6/2014 | Bau et al. |

FOREIGN PATENT DOCUMENTS

| | | |
|---|---|---|
| JP | H05326117 A | 12/1993 |
| JP | 2002532239 A | 10/2002 |
| JP | 2003323219 A | 11/2003 |
| JP | 200431147 A | 1/2004 |
| JP | 2014146478 A | 8/2014 |
| WO | 02024322 A3 | 3/2002 |
| WO | WO2009019658 A2 | 2/2009 |
| WO | WO2014052950 A1 | 4/2014 |
| WO | WO2016163946 A1 | 10/2016 |
| WO | WO2016163956 A1 | 10/2016 |
| WO | WO2016163957 A1 | 10/2016 |

OTHER PUBLICATIONS

Foreign Communication From a Related Counterpart Application, European Extended Search Report dated Aug. 12, 2016, European Application No. 15788314.1, National Phase of PCT/SG2015050062.

Foreign Communication From a Related Counterpart Application, International Search Report and Written Opinion dated Jun. 17, 2016, International Application No. PCT/SG2016/050171, filed Apr. 7, 2016.

Foreign Communication From a Related Counterpart Application, International Preliminary Report dated Apr. 7, 2017, International Application No. PCT/SG2016/050171, filed Apr. 7, 2016.

Foreign Communication from a Related Counterpart—International Search Report and Written Opinion, dated Jun. 17, 2016, PCT/SG2016/050172, filed Apr. 7, 2016.

Foreign Communication from a Related Counterpart—International Preliminary Report on Patentability, dated Apr. 7, 2017, PCT/SG2016/050172, filed Apr. 7, 2016.

Ohlander, A., et al., "Real-Time Monitoring of Melting Curves on DNA Microarrays in Plastic Lab-On-Foil System Using Silicon Photomultiplier Detectors" 18th International Conference on Minaturized Systems for Chemistry and Life Sciences, Oct. 26, 2014.

Sim, Lye Hock, et al., "Fluidic Chip," filed Oct. 7, 2017, U.S. Appl. No. 15/727,588.

Sim, Lye Hock, et al., "Digital PCR Device," filed Oct. 7, 2017, U.S. Appl. No. 15/727,589.

Office Action dated Feb. 23, 2017, U.S. Appl. No. 14/893,002, filed Nov. 20, 2015.

Final Office Action dated Jun. 6, 2017, U.S. Appl. No. 14/893,002, filed Nov. 20, 2015.

Advisory Action dated Sep. 27, 2017, U.S. Appl. No. 14/893,002, filed Nov. 20, 2015.

Notice of Allowance dated Oct. 24, 2017, U.S. Appl. No. 14/893,002, filed Nov. 20, 2015.

* cited by examiner

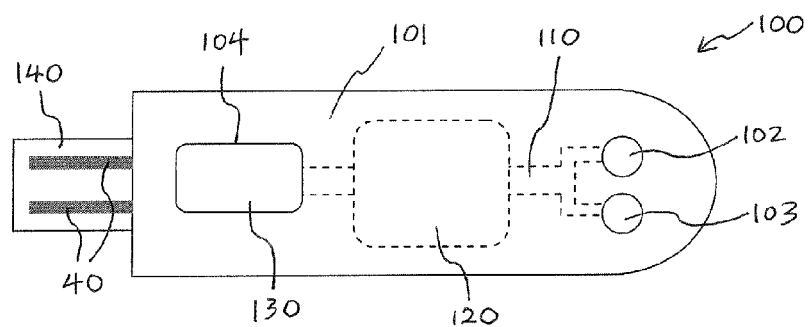
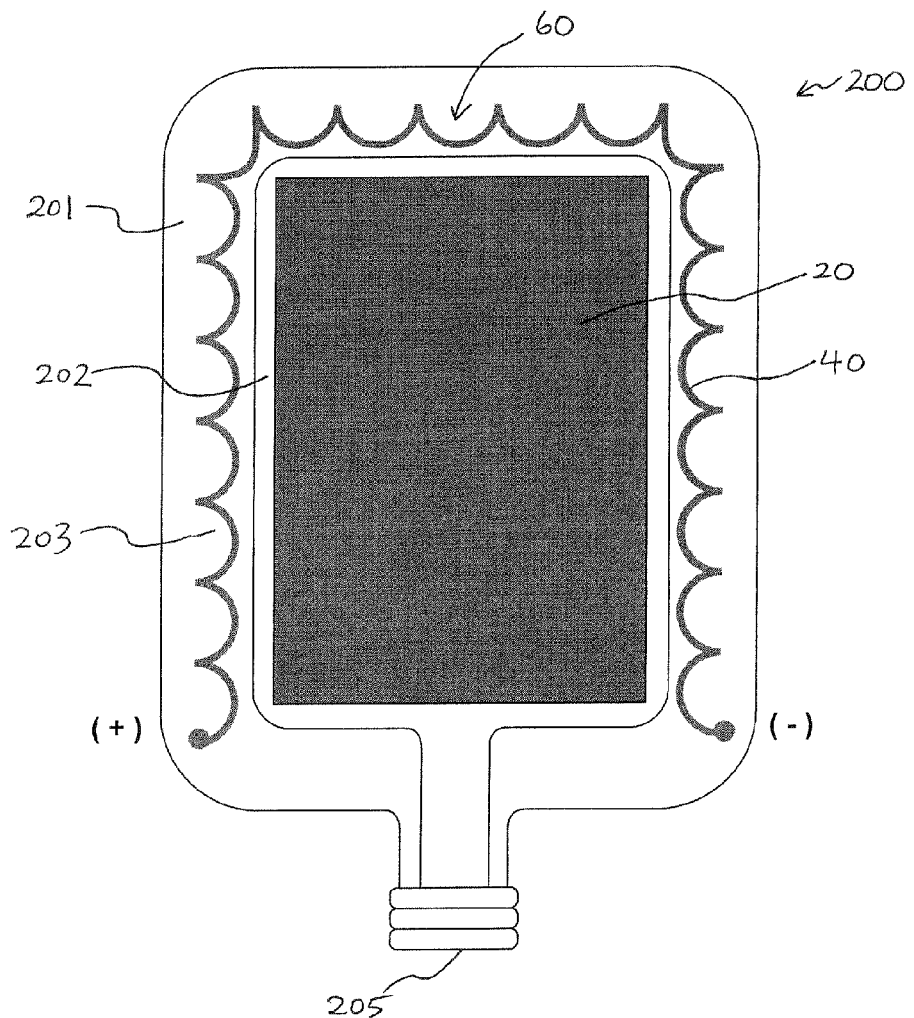
Fig. 4

DC HEATER

CROSS-REFERENCE TO RELATED APPLICATIONS

The present application is a filing under 35 U.S.C. 371 as the National Stage of International Application No. PCT/SG2015/050062, filed Apr. 7, 2015, entitled "A DC HEATER," which is incorporated herein by reference in its entirety for all purposes

FIELD OF THE INVENTION

This invention relates to a dc (direct current) heater and its applications.

BACKGROUND OF THE INVENTION

Electric heaters are commonly used in many applications. However, there are currently no dc heaters that can be heated to up to or more than 100° C. using a voltage of 9 volts or less and in which the dc heater is one inch square or smaller. Such a small heater powered by a low voltage source will open up possibilities for many applications in terms of space and power saving, in particular for portable and even disposable use.

For example, PCR is a commonly used method to make multiple copies of a DNA sequence for various application such as DNA cloning for sequencing, diagnosing disease, identifying individuals from DNA samples, and performing functional analyses of genes. In PCR, replication of the DNA sequence takes place in multiple thermal cycles, with each cycle typically having three main steps: denaturation, annealing and extension. In the denaturation step, a double-stranded DNA template is heated to about 94-98° C. for 20-30 seconds to yield single-stranded DNA. In the annealing step, primers are annealed to the single-stranded DNA by lowering the temperature to about 50-65° C. for 20-40 seconds. In the extension step, using a DNA polymerase (such as Taq), a new double-stranded DNA is synthesized by extending the primer that has been annealed to the single-stranded DNA at an optimum activity temperature of the DNA polymerase (75-80° C. for Taq). Appreciably, replication of the DNA is exponential as the new double-stranded DNA formed in a cycle undergoes denaturation, annealing and extension in the next cycle, such that each cycle effectively doubles the number of DNA sequences obtained. In addition to the three main steps mentioned above, an initialization step may be required if the DNA polymerase used is heat activated, and the final extension step of the last cycle may be held for a longer period of time (e.g. 5-15 minutes) to ensure that there are no remaining single-stranded DNA fragments.

Thus, any device for performing the PCR needs to be able to perform the repeated thermal cycles in order for the steps of denaturation, annealing and extension to take place. This involves heating and cooling the reaction to the required temperatures and holding the required temperatures for the necessary lengths of time. Given that temperatures go up to nearly and/or more than 100° C., existing microfluidic or lab-on-chip PCR devices typically require an external thermal cycler to supply the necessary heat, thereby limiting theft true portability and size during use.

In other applications such as the warming up of blood bags for transfusion use or even simply heating up of food stored in bags commonly known as retort pouches, bulky heating devices requiring significantly higher voltage sources than 9 volts are currently typically used, thereby limiting the portability and convenience for their users.

SUMMARY OF INVENTION

According to a first aspect, there is provided a dc heater comprising: a discrete heating area made of a heat conductive material disposed on a surface that is electrically non-conductive; and at least one conductive trace configured to be connected to a dc voltage source and to heat the discrete heating area to a uniform temperature when connected to the dc voltage source, the at least one conductive trace disposed in an undulating configuration on the surface at least partially around the discrete heating area.

The dc voltage source may supply up to only 9 volts.

The dc voltage source may supply up to only 5 volts.

The at least one conductive trace may comprise terminals configured with a USB interface for connection with a USB port of a host device providing the dc voltage source The undulating configuration may be at least one selected from the group consisting of: scalloped, saw-toothed, waved, square waved, dove-tailed, postage stamp edged, and a modified form of each aforementioned undulating configuration.

The surface may be on a flexible sheet material.

The dc heater may further comprise a protective layer provided over the surface, the discrete heating area and the at least one conductive trace.

Only the discrete heating area may be configured to be placed adjacent an item to be heated.

According to a second aspect, there is provided a disposable PCR device comprising: a base sheet; a top sheet having at least one sample collection opening and a transparent portion configured as a result window; a microfluidic channel comprising a PCR chamber provided between the base sheet and the top sheet, the microfluidic channel configured to be in fluid connection with the at least one sample collection opening, a portion of the microfluidic channel downstream of the PCR chamber being viewable through the result window; and the dc heater of the first aspect provided between the base sheet and the top sheet such that the discrete heating area of the dc heater is adjacent the PCR chamber.

The base sheet, the top sheet and the microfluidic channel are formed of at least one flexible sheet material.

According to a third aspect, there is provided an electric-heating bag configured for storage of a product therein, the electric-heating bag comprising: a first sheet of flexible material sealed to a second sheet of polymeric material to define a cavity therebetween and forming a border comprising the first sheet of flexible material and the second sheet of flexible material around the cavity, and the dc heater of the first aspect, wherein the discrete heating area is disposed on a portion of the first sheet of flexible material forming a first wall of the cavity, and wherein the at least one conductive trace is disposed in the undulating configuration on the border of the first sheet of flexible material.

The electric-heating bag may further comprise a closeable opening in fluid communication with the cavity and configured for dispensing the product therethrough.

The closeable opening may be configured to be connectable to a tubing, the electric-heating bag configured to be a blood bag configured for at least one of: collection and storage of blood from a patient, and providing blood or a blood product to a patient.

BRIEF DESCRIPTION OF FIGURES

In order that the invention may be fully understood and readily put into practical effect there shall now be described by way of non-limitative example only exemplary embodiments of the present invention, the description being with reference to the accompanying illustrative drawings.

FIG. 3 is a schematic illustration of an exemplary disposable PCR device comprising the dc heater of FIG. 1.

FIG. 4 is a schematic illustration of an exemplary electrically-heated bag comprising the dc heater of the present invention.

DETAILED DESCRIPTION

Figure 1:
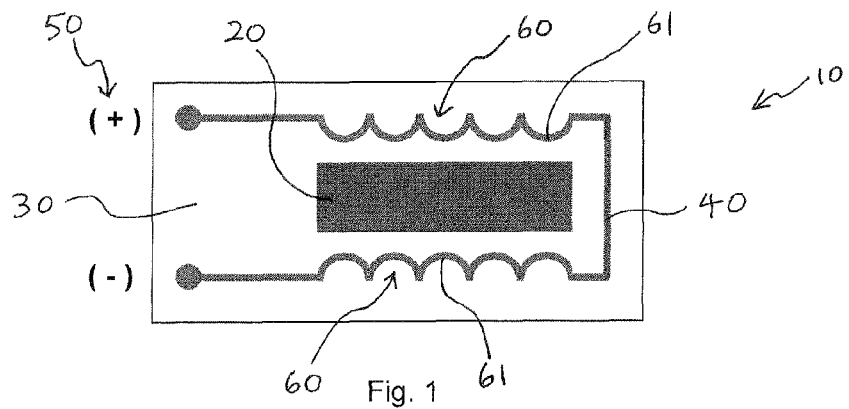
FIG. 1 is a schematic illustration of a first exemplary embodiment of a dc heater of the present invention.

Exemplary embodiments of the dc heater 10 and its various applications will be described below with reference to FIGS. 1 to 5, in which the same reference numerals are used to denote the same or similar parts.

In a first embodiment of the dc heater 10 as shown in FIG. 1, the dc heater 10 comprises a discrete heating area 20 that is made of a heat conductive material disposed on a surface 30 that is electrically non-conductive. The surface 30 may be made of a polymeric material, for example, and may be relatively stiff (e.g., a laminate such as those used for printed circuit boards) or flexible (e.g., a flexible polypropylene sheet, polymeric film, cardstock etc.).

The dc heater 10 also comprises a conductive trace 40 configured to be connected to a dc voltage source 50 (indicated as (+) and (−) in the figures) and to heat the discrete heating area 20 to a uniform temperature when connected to the dc voltage source 50. The discrete heating area 20 is not in electrically conductive contact with the conductive trace 40. The conductive trace 40 and discrete heating area 20 are preferably made of the same conductive material, such as a conductive ink or suitable metal.

Figure 2:
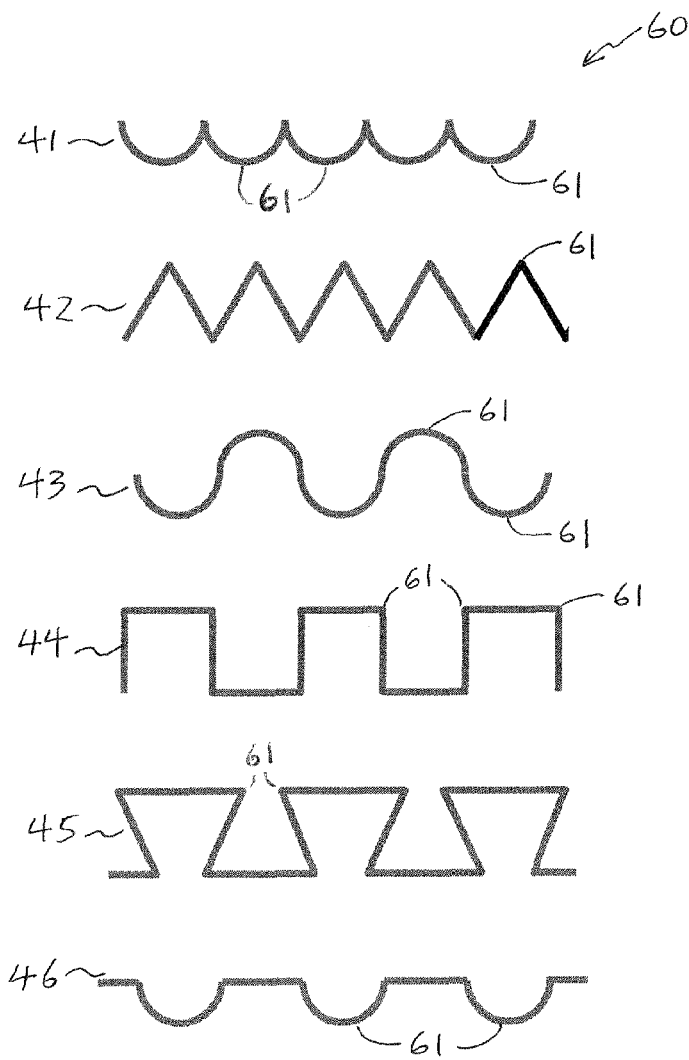
FIG. 2 is a schematic illustration of various embodiments of an undulating configuration of a conductive trace of the dc heater of the present invention.

The conductive trace 40 is disposed in an undulating configuration 60 on the surface 30 at least partially around the discrete heating area 20. In FIG. 1, the undulating configuration 60 has a scalloped 41 form as shown in FIG. 2, comprising a series of circular arcs curving in the same direction, meeting at angles, forming points outward and with the arcs convex towards the discrete heating area 20. In this embodiment, the discrete heating area is rectangular in shape and the undulating configuration 60 is provided on only two opposite sides of the discrete heating area 20.

In alternative embodiments, the undulating configuration 60 may be saw-toothed 42, waved 43, square waved 44, dove-tailed 45, postage stamp edged 46, or a modified form of each of the aforementioned undulating configurations 60, as shown in FIG. 2. The undulating configuration 60 can be considered to comprise repeating units of curves or bends of the conductive trace 40 that may or may not be interspersed with straight portions. It has been found that a higher temperature point occurs at an external or convex edge or corner 61 of wherever the conductive trace 40 curves or bends. Therefore, providing an appropriate undulating configuration 60 of the conductive trace 40 on the surface 30 results in multiple higher temperature points being positioned close to the discrete heating area 20. In this way, sufficient heat can be generated by the undulating configuration 60 of the conductive trace 40 to heat a discrete heating area 20 having dimensions of, for example, only 3 mm by 10 mm to a desired high temperature of, for example, 100° C. or higher, using a dc voltage of only 5 volts as may be provided by a USB port of a laptop, for example.

The dc voltage source 50 may be any suitable power supply having a voltage of 9 volts or less, depending on the application that the dc heater 10 is configured for. For example, the dc voltage source 50 may be in the form of batteries, or, as mentioned above, a USB port of a laptop or computer or other host device that has its own power supply and a voltage of 5 volts or less. In this way, the dc heater 10 is readily portable as it can be powered with batteries or other portable devices that can supply the low dc voltage used by the dc heater 10.

By configuring the discrete heating area 20 to have no electrical contact with any part of the conductive trace 40, it is found that all of the discrete heating area 20 has a uniform temperature when the dc heater 10 reaches steady-state heating. Accordingly, by configuring the heater such that only the discrete heating area 20 is disposed adjacent an item to be heated, it is expected that the item will therefore experience relatively uniform heating from the discrete heating area 20. The term "adjacent" here is used to mean that the item is disposed on or over the discrete heating area 20, or the discrete heating area 20 is disposed over the item, depending on the configuration of the dc heater for its application of use. This feature of uniform heating is particularly important for biological applications where the item may be a biological sample or product that is sensitive to heat and it is important that no part of the item is exposed to excessive temperatures or temperature spikes that may cause damage.

Preferably, the dc heater 10 also has a protective layer (not shown) provided over the surface 30, the discrete heating area 20 and the conductive trace 40 in order to protect them from damage due to exposure to the environment. The protective layer preferably also provides an electrically insulating function for safety of the user.

A practical application of the dc heater 10 described above is that of a disposable PCR device 100 as shown in FIG. 3. The PCR device 100 comprises a base sheet (not shown), a top sheet 101, a microfluidic channel 110 comprising a PCR chamber 120 provided between the base sheet and the top sheet 101, and the dc heater (not shown) provided also between the base sheet and the top sheet 101. The base sheet and the top sheet 101 thus house the PCR chamber and the dc heater in a package that is less than 3 mm thick.

The top sheet 101 should have at least one sample collection opening 102 for placing a DNA sample therein, and may have one or more other openings 103 for adding reagents into the PCR chamber. The top sheet 101 also has a transparent portion configured as a result window 104 for viewing results arising from the PCR.

The microfluidic channel is configured to be in fluid connection with the sample collection opening 102 so that a DNA sample can be flowed into the PCR chamber 120 in the device 100. A portion 130 of the microfluidic channel 110 downstream of the PCR chamber 120 is configured to be viewable through the result window 104.

In the disposable PCR device 100, the discrete heating area and conductive trace are preferably disposed on a surface that is made of a thin flexible material such as a polymeric film, so that the dc heater occupies extremely little space in the disposable PCR device 100. The dc heater is configured such that only the discrete heating area of the dc heater is adjacent the PCR chamber 120 in the device 100 while the conductive trace including the undulating portion is spaced apart from the PCR chamber 120. In this way, the discrete heating area provides uniform heat to the PCR chamber 120 when the discrete heating area is heated by the undulating portion, so as to provide the thermal cycling necessary for the PCR to performed in the device 100.

If the disposable PCR device 100 is to have its dc voltage source supplied by a USB host device, the PCR device 100 may additionally be provided with a tab 140 where the conductive trace 40 is configured with a USB interface for connection with the USB host device, as shown in FIG. 3.

In another application of the dc heater 10, the dc heater 10 may be disposed on an electric-heating bag 200 configured for storage of a product therein, as shown in FIG. 4. In this application, the electric-heating bag 200 may have a first sheet 201 of flexible material sealed to a second sheet of flexible material (not shown) to define a cavity 202 therebetween. The sealing should be such that a border 203 comprising the first sheet 201 of flexible material and the second sheet of flexible material is also formed around the cavity 202. The discrete heating area 20 of the dc heater 10 is disposed on a portion 204 of the first sheet 201 of flexible material forming a first wall of the cavity 202. The conductive trace 40 of the dc heater 10 is disposed in the undulating 60 configuration on the border 203 of the first sheet 201 of flexible material 201. In this way, product contained in the cavity 202 is heated to a desired temperature by heat from the discrete heating area 20 that is heated when the conductive trace 40 is connected to a dc voltage source.

If the application of the electric-heating bag 200 is to store a product that is to be dispensed from the bag 200, for example, the product may be a food product for consumption or a blood product for transfusion, then the bag 200 would also have a closeable opening 205 in fluid communication with the cavity 202 and configured for dispensing the product therethrough. In the specific instance where the bag 200 is intended to be a blood bag configured for the purposes of collection and storage of blood from a patient, and/or providing blood or a blood product to a patient, the closeable opening 205 is preferably further configured to be connectable to a tubing (not shown) having an end configured to establish an intravenous connection with the patient.

Figure 5:
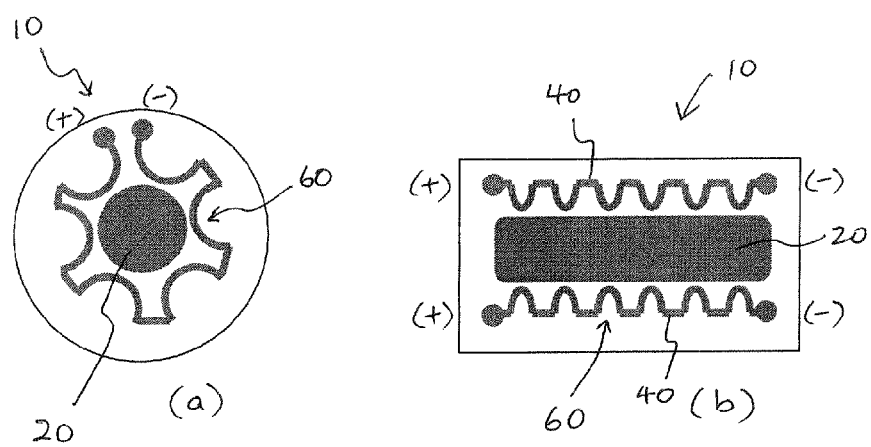
FIGS. 5(a) and 5(b) are schematic illustrations of alternative exemplary configurations of the dc heater of the present invention.

Whilst there has been described in the foregoing description exemplary embodiments of the present invention, it will be understood by those skilled in the technology concerned that many variations in details of design, construction and/or operation may be made without departing from the present invention. For example, alternative configurations of the discrete heating area 20 and undulating configuration 60 can be envisaged to be provided according to the actual application of the dc heater 10 as may be required, without limit to the possible shapes and sizes of these features. Some examples are shown in FIG. 5. As can be seen in FIG. 5(*b*), the dc heater 10 has two conductive traces 40, instead of one, to provide the undulating configuration 60 around the discrete heating area 20. The number of conductive traces 40 in the dc heater 10 can thus be one or more.

The invention claimed is:

1. A disposable PCR device comprising:
   a base sheet;
   a top sheet having at least one sample collection opening and a transparent portion configured as a result window;
   a microfluidic channel comprising a PCR chamber provided between the base sheet and the top sheet, the microfluidic channel configured to be in fluid connection with the at least one sample collection opening, a portion of the microfluidic channel downstream of the PCR chamber being viewable through the result window; and
   a dc heater provided between the base sheet and the top sheet such that a discrete heating area of the dc heater is adjacent the PCR chamber, the dc heater comprising:
      the discrete heating area made of a heat conductive material disposed on a surface that is electrically non-conductive; and
      at least one conductive trace configured to be connected to a dc voltage source and to heat the discrete heating area to a uniform temperature when connected to the dc voltage source, the at least one conductive trace disposed in an undulating configuration on the surface at least partially around the discrete heating area.

2. The disposable PCR device of claim 1, wherein the base sheet, the top sheet and the microfluidic channel are formed of at least one flexible sheet material.

3. An electric-heating bag configured for storage of a product therein, the electric-heating bag comprising:
   a first sheet of flexible material sealed to a second sheet of polymeric material to define a cavity therebetween and forming a border comprising the first sheet of flexible material and the second sheet of flexible material around the cavity; and
   a dc heater that comprises
      a discrete heating area made of a heat conductive material disposed on a surface that is electrically non-conductive; and
      at least one conductive trace configured to be connected to a dc voltage source and to heat the discrete heating area to a uniform temperature when connected to the dc voltage source, the at least one conductive trace disposed in an undulating configuration on the surface at least partially around the discrete heating area, wherein the discrete heating area is disposed on a portion of the first sheet of flexible material forming a first wall of the cavity, and wherein the at least one conductive trace is disposed in the undulating configuration on the border of the first sheet of flexible material.

4. The electric-heating bag of claim 3, further comprising a closeable opening in fluid communication with the cavity and configured for dispensing the product therethrough.

5. The electric-heating bag of claim 4, wherein the closeable opening is configured to be connectable to a tubing, the electric-heating bag configured to be a blood bag configured for at least one of: collection and storage of blood from a patient, and providing blood or a blood product to a patient.

* * * * *